US006040705A

United States Patent [19]

Garcia et al.

[11] Patent Number: 6,040,705

[45] Date of Patent: Mar. 21, 2000

[54] ROLLING ELECTRICAL CONTACTOR

[75] Inventors: Douglas J. Garcia, Escondido, Calif.; Christian Saulnier, Boutigny, France

[73] Assignee: Electro Scientific Industries, Inc., Portland, Oreg.

[21] Appl. No.: 09/032,696

[22] Filed: Feb. 27, 1998

Related U.S. Application Data

[60] Provisional application No. 60/056,750, Aug. 20, 1997.

[51] Int. Cl.$^{7}$ .................................................. G01R 1/06

[52] U.S. Cl. .................................................. 324/762

[58] Field of Search .................................. 324/754, 755, 324/756, 757, 538; 235/139

[56] References Cited

U.S. PATENT DOCUMENTS

| | | | |
|---|---|---|---|
| 2,653,298 | 9/1953 | McKinley | 324/695 |
| 3,581,889 | 6/1971 | Abraham . | |
| 3,655,041 | 4/1972 | Baker et al. . | |
| 3,810,540 | 5/1974 | Georges . | |
| 3,915,850 | 10/1975 | Crownover | 209/560 |
| 4,500,003 | 2/1985 | Cedrone . | |
| 4,747,479 | 5/1988 | Herrman . | |
| 4,978,913 | 12/1990 | Hamuro et al. . | |
| 5,034,749 | 7/1991 | Jungblut et al. . | |
| 5,131,206 | 7/1992 | Sillner . | |
| 5,225,777 | 7/1993 | Bross et al. | 324/754 |
| 5,568,870 | 10/1996 | Utech . | |
| 5,596,283 | 1/1997 | Mellitz et al. | 324/754 |
| 5,598,917 | 2/1997 | Thomas | 200/548 |

*Primary Examiner*—Josie Ballato
*Assistant Examiner*—T. R. Sundaram
*Attorney, Agent, or Firm*—John J. Murphey

[57] ABSTRACT

A replaceable roller turns on an axle supported at the end of a cantilever arm. The roller is preferably brass or other highly conductive, durable material for making electrical contact with a terminal of an electrical device, e.g. a ceramic capacitor. The arm is made from a highly conductive, resilient material. There are a plurality of such arms with rollers connected in parallel to a holding module, preferably with the rollers aligned. The holding module is secured to a structure, e.g. a component test handler jig, and provides a conductive path between each roller/cantilever arm assembly and the test jig. In operation a stream of components are indexed to the rollers such that their terminals are aligned with the rollers. The rollers intrude slightly into the path of the compnents so that as they are indexed to the rollers, the components deflect the rollers causing them to roll across the components' terminals. The resilience of the cantilever arms presses the rollers against the terminals to make good electrical contact. Preferably the roller/cantilever arm assemblies are easily disconnectable from their holders so they can be quickly replaced when needed, and this patent describes such a preferred connection mechanism.

10 Claims, 5 Drawing Sheets

ROLLING ELECTRICAL CONTACTOR

This application claims the benefit of U.S. Provisional Application No. 60/056,750, filed Aug. 20, 1997.

BACKGROUND OF THE INVENTION

This invention relates in general to the field of cantilever type electrical contactors, and more particularly to those that wipe (as "wipe" is defined below) across an opposing contact area while making contact therewith.

There are presently two types of contactors used to temporarily connect to miniature electronic devices for the purpose of electrical measurement: A "wiping" or cantilever contactor, and an actuated contactor. A cantilever type contactor typically has a flat spring metal arm which is canted or angled with respect to a device to be contacted. At the free end of the arm is a contact point. A contacting area of the device to be contacted is moved, actually or relatively, such that the contact point rubs, i.e. wipes, against the area and the cantilever arm is deflected slightly. Due to the spring in the arm it applies pressure on the contact area, sufficient pressure for good electrical contact. This wiping technique can use one cantilever arm and one stationary contact point, or two cantilever arms.

The wiping method, although simple and reliable, has certain drawbacks. The contacting pressure, supplied by the cantilever arm, needs to be controlled carefully. Too little pressure will result in poor electrical contact, too much pressure can damage the terminations, i.e. the contacting areas, of the device being contacted, particularly when the terminations are coated with a tin or tin/lead solder plating. Termination damage to the device is defined as any removal of the solder plating, which is typically only 100–200 microinches thick. The cantilever contact tip, being relatively stationary, wipes across the entire exposed length of the device termination, creating a relatively large mark on the termination, and greatly increasing the chances of termination damage.

Also, due to the increasing miniaturization of electronic devices, minimal clearances exist between the surface of the holding fixtures needed to hold the devices during testing and the device terminations. The result is that the cantilever tips periodically come into contact with the holding fixture. Since the cantilever tip is relatively stationary, it is abraded by the test fixture material, which is typically FR-4 glass epoxy, or a similar non-conductive material, which tends to have a moderate or high abrasive quality. The cantilever tips become rough from this contact and tend to further damage the device terminations. Also the contactor tips become dirty, either by oxidation or adherence of contaminants to the contact tips, or a combination of both. Access to the contact tips for cleaning is difficult due to the close proximity of the contact tips to the devices measured and the device holding fixture(s).

The actuated contactor technique uses moving contact tips, usually in a reciprocating motion, which are brought into contact with the devices. The contact tips are actuated for each test cycle, moved until they make contact with the device, then held stationary during the measurement of the device. After the measurement, the contacts are moved away from the device, and the device's holding plate or fixture is indexed, bringing the next device into position for the subsequent measurement. Actuated contacts can be made with very small tip sizes in order to reduce any marking of the termination ends of the tested device, unlike the wiping contact technique. Due to the high throughputs of production testing equipment, however, this actuation cycle must be done at very high speed and at rapid rates. For example, a component tester such as the Palomar Model 3300 would require 37,500 contactor actuation cycles per hour, running 150,000 parts per hour. If the components used for the actuation mechanism lasted 30,000,000 cycles, they would have to be replaced every 40 days, assuming 20 hours of machine run time per day. If the actuation time was only 10 ms in each actuation direction, the system throughput would be decreased by 10,000 parts per hour as well. Actuated contacts can also push or pull the device out of its holding plate/fixture, and the contact tips tend to be more expensive, requiring moving or flexible electrically conductive components, such as gold plated springs, or very flexible wire segments.

The contactor of this invention will allow rapid and repeated electrical connection to the terminations of many types of devices with little or no damage or markings. The electrical contactor according to this invention is a significant advance over the prior art. It eliminates the damage done to the solder plating on the terminations of devices due to the "wiping" action of the cantilever type contactors and is simpler and has a longer life than the actuated type contactor. It is particularly useful in component handlers and testers for the processing and testing of electrical circuit components, for example ceramic capacitors. (As used herein the term "component" refers to ceramic capacitors and any other electrical device having a form that allows it to be contacted by this invention.)

Other advantages and attributes of this invention will be readily discernable upon a reading of the text hereinafter.

SUMMARY OF THE INVENTION

An object of this invention is to provide a contactor which will not damage the terminations of small electronic devices while making contact therewith.

An additional object of this invention is to provide a contactor having a rolling point of contact.

An additional object of this invention is to provide a contactor having a rolling point of contact mounted on a resilient arm.

An additional object of this invention is to provide a contact having a rolling point of contact which is easily removable from a resilient arm.

An additional object of this invention is to provide a contact having a rolling point of contact which is reliable.

An additional object of this invention is to provide a contact having a rolling point of contact which has a long life.

An additional object of this invention is to provide a contact having a rolling point of contact which is narrow enough to allow multiple contacts to fit into a testing module for testing multiple electronic devices.

An additional object of this invention is to provide a multiple contactor module for holding a plurality of contactors for simultaneously making electrical measurements on small electronic devices.

An additional object of this invention is to provide a multiple contactor module for holding a plurality of contactors to provide electrical continuity from the contactor arm to the module.

An additional object of this invention is to provide a multiple contactor module for holding a plurality of contactors and having an open position to allow the easy removal and replacement of the contactors in the module.

An additional object of this invention is to provide a multiple contactor module for holding a plurality of contactors having a positive means of locating the position of the contactors in the module.

These objects, and other objects expressed or implied in this document, are accomplished by a rolling contactor for providing electrical signal communication between a component terminal and a support structure, comprising (1) an electrically conductive roller for making rolling contact with the component terminal, (2) a holding module connectable to the support structure and in signal communication therewith, and (3) a resilient arm for cantilevering the roller from the holding module, the arm including a path for communicating signals between the roller and the holding module. The roller is preferably brass or other highly conductive, durable material for repeatedly making sound electrical contact with component terminals (for example, terminations of ceramic capacitors). The arm is preferably made from a highly conductive material to communicate signals between the roller and the holder. Preferably there are a plurality of such roller/cantilever arm assemblies connected in parallel to the holding module, preferably with the rollers aligned, to make simultaneous contact with a plurality of components, or component terminals. The holding module is secured to a structure (for example, a test jig of a component handler), and provides respective signal communication paths between each roller/cantilever arm assembly and the electronics of the structure (for example, a computer interface of a component handler). Preferably the roller/cantilever arm assemblies are easily disconnectable from their holders so they can be quickly replaced when needed.

DESCRIPTION OF THE PREFERRED EMBODIMENT

Figures 1A, 1B, 1C, 1D:
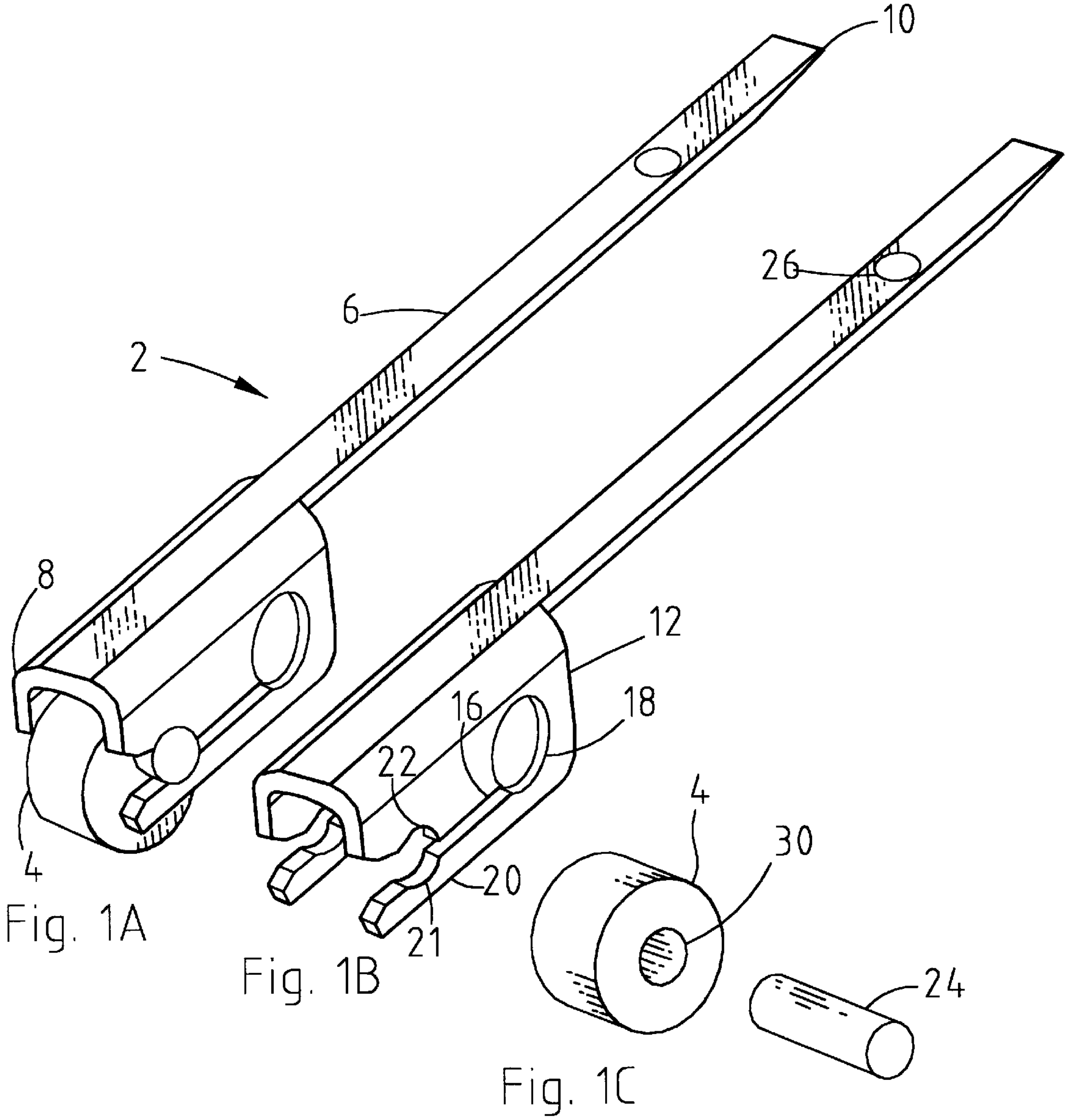
FIGS. 1A–1D are pictorial views of a preferred embodiment of the invention and its constituents.
Figures 2A, 2B, 2C, 2D, 2E:
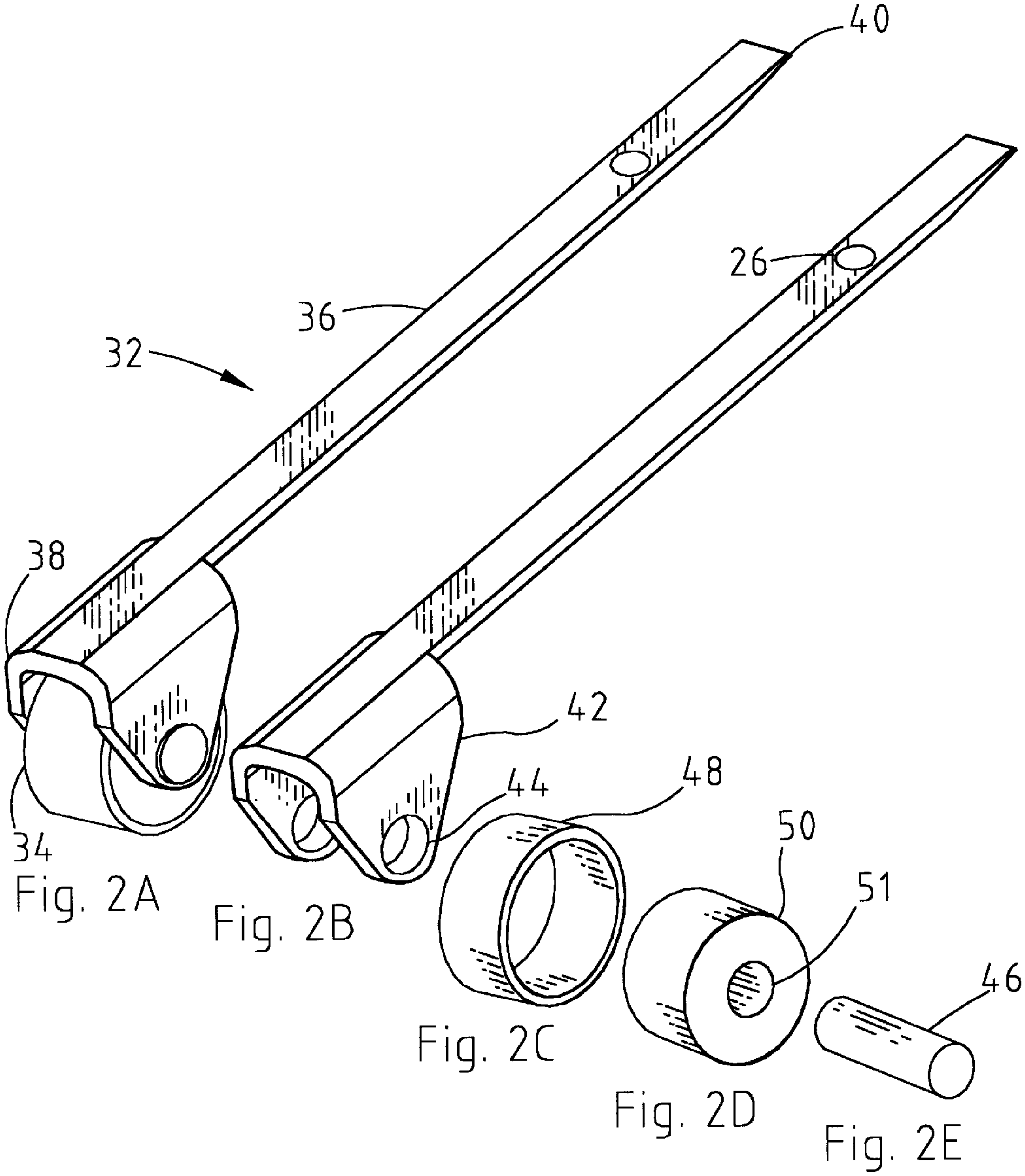
FIGS. 2A–2E are pictorial views of a second embodiment of the invention and its constituents.
Figure 3A:
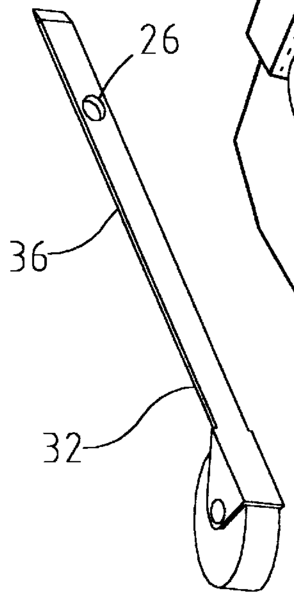
FIGS. 3A and 3B are pictorial views of a cantilever rolling contactor according to this invention, and a holding module with a plurality of such contactors installed therein.
Figure 3B:
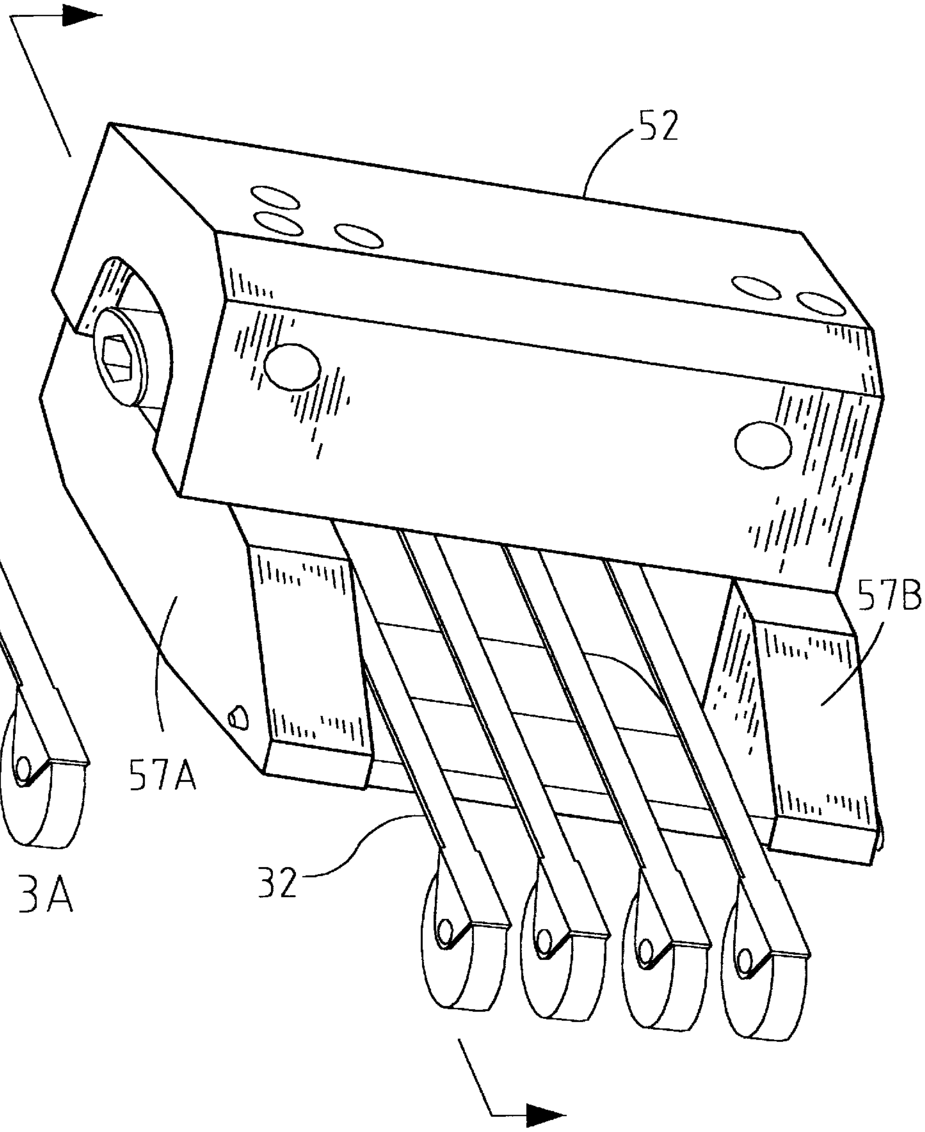

Referring to FIGS. 1A–1D, the contactor of the preferred embodiment of this invention is generally designated as 2 and consists of a rotatable contact wheel, or "roller" 4 supported by an elongated cantilever arm 6. The arm is symmetrical about its longitudinal axis and has a contact or tip end 8 and a plug end 10. A pair of parallel, symmetrical flanges 12 project orthogonally from opposite sides of the arm at its tip end. Preferably the arm is of uniform rectangular crosssection except for a slight taper at the plug end. Each flange is partially bifurcated by a narrow slit 16 running parallel to the arm 6, the slit being open at the tip end and intersecting a circular strain relief hole 18 defined by and at the rear of the flange. The slit and relief hole create a lower resilient prong 20. Opposing semi-circular cutouts, 21 and 22, are defined respectively on opposite sides of the slit near the tip end, the cutouts being aligned to receive respective ends of an axle 24 of the roller 4. The open ends of the slits are tapered to allow the axle to be pressed into the slit, causing the prongs to flex downward, and to be pressed further into the cutouts. Once in the cutouts the axle is held firmly by the prongs so that it does not rotate. A locating hole 26 is defined by the arm intermediate the arm's tip and its plug end.

Referring again to FIGS. 1A–1D, the roller 4 is cylindrical in shape for rolling and preferably comprises a solid piece of brass or similarly highly conductive and durable material to make electrical contact with a device termination. The roller has an axial length slightly less than the gap between the flanges 12 to allow it to roll on its axle 24 freely. In this respect the roller defines an axial hole 30 sized to allow the roller to turn freely on its axle. The axle preferably comprises copper impregnated graphite or similar material to provide electrical contact between the roller and the flanges 12 of the arm. The composition of the roller also provides a lubricated surface for the roller.

An advantage of the preferred embodiment is that the configuration of the flanges allows the rollers, and their axles, to be easily replaced. When, due to wear or defects, a roller or axle needs to be replaced, it can easily be forcibly pulled out of the slit and replaced. The rolling contact is also an improvement over the cantilever wiping contact because it is more easily cleaned. Since the roller's contacting surface is continually exposed, it is easily accessible for cleaning, unlike a typical cantilever contact tip.

Referring to FIGS. 2A–2E, the contactor of a second embodiment of this invention is generally designated as 32 and also consists of a rotatable wheel, or "roller" 34 supported by an elongated cantilever arm 36. The arm is symmetrical about its longitudinal axis and has a contact or tip end 38 and a plug end 40. A pair of parallel, symmetrical flanges 42 project orthogonally from opposite sides of the arm at its tip end. Preferably the arm is of uniform rectangular crosssection except for a slight taper at its plug end. The flanges each define a hole 44, the holes being aligned for journaling respective ends of an axle 46. As in the preferred embodiment, a locating hole 26 is defined by the arm intermediate the arm's tip and its plug end.

Referring again to FIGS. 2A–2E, the roller has an annular sleeve 48 and a cylindrical core 50 over which the sleeve is frictionally fitted, e.g. press-fitted. The sleeve is the part of the roller that makes physical and electrical contact with the termination of a target device. The core 50 is thick-walled, relative to the sleeve, and has the same axial length. The axle 46 is press fitted into the axial hole 51 defined by the core. All these frictional fittings create a roller assembly having a tight, frictional, non-slip fit between all its constituent parts. As for installation of the second embodiment constituents, the axle can be press-fitted into the core after the core with sleeve have been installed between the parallel flanges 42.

Concerning the second embodiment, the annular sleeve preferably comprises brass or other highly conductive and durable metal or composite material. The core is preferably made of a highly conductive composite material such as copper impregnated graphite. The axle is made of a highly conductive and durable material such as brass. The axle is in electrical contact with the flange of the arm, and thus there is electrical continuity between the sleeve and the contactor arm.

Figure 4:
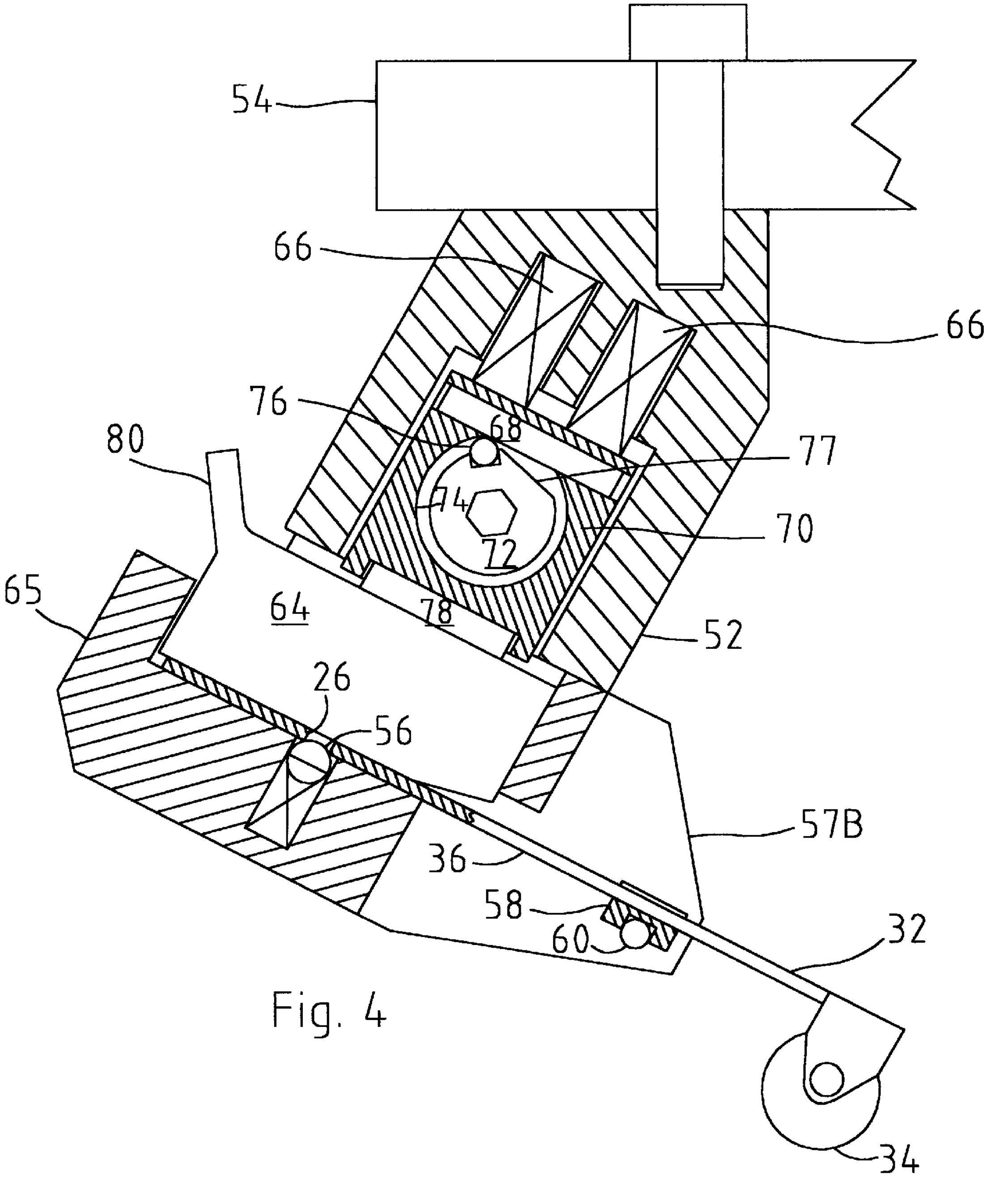
FIG. 4 is a cross-sectional view of the holding module of FIG. 3B in its closed position with the contactors securely held in proper position.
Figure 5:
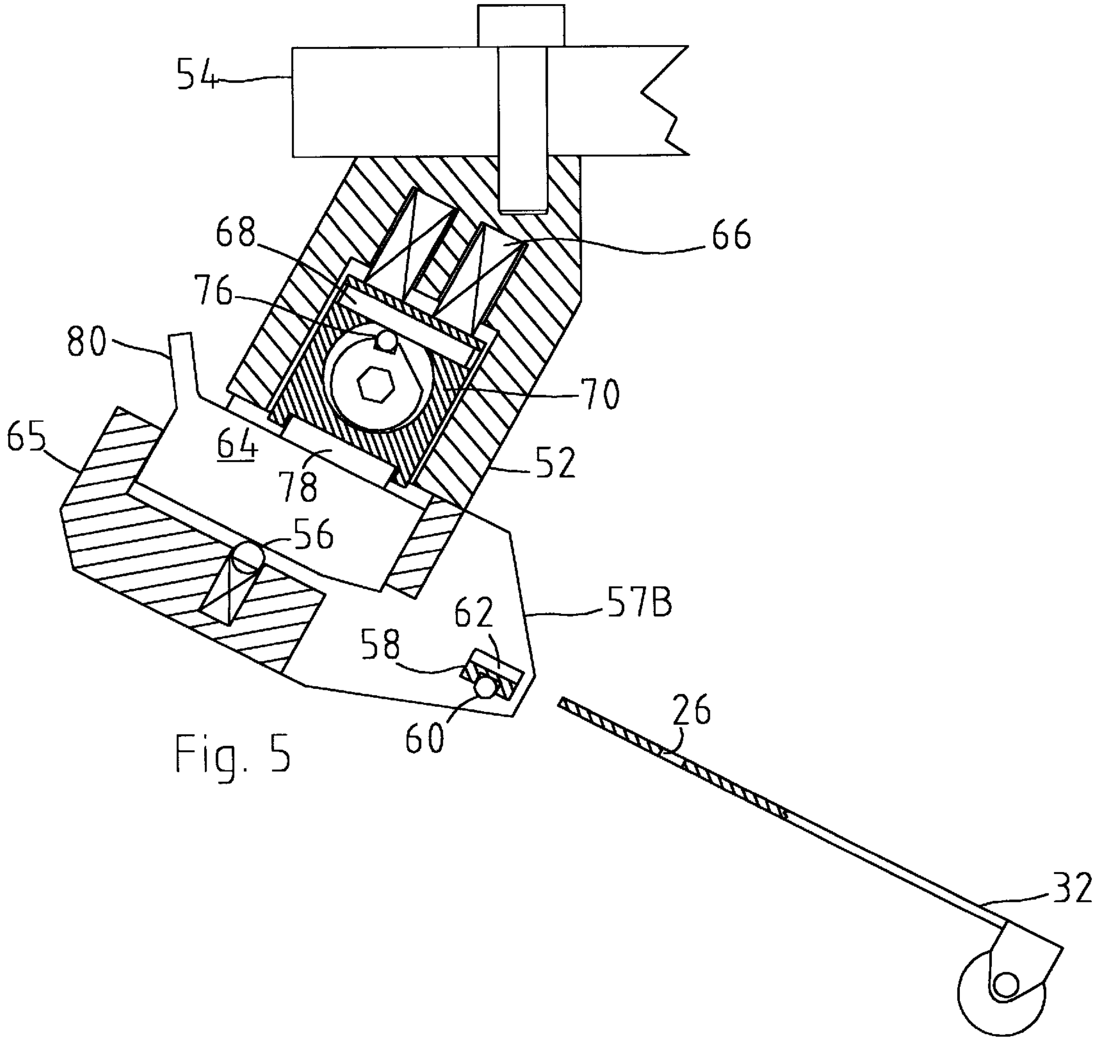
FIG. 5 is a cross-sectional view of the holding module of FIG. 3B in its open position, with an individual contactor positioned for installation in the module.

Referring to FIGS. 3A, 3B, 4 and 5, the contactors of FIGS. 1A–1D and 2A–2E can be installed in parallel into a module 52 for contacting multiple devices (not shown) at a time. (In this regard, it should be understood that, for illustrative purpose only, the contactor of the second embodiment is shown and that the preferred embodiment contactor could be installed and fitted into the module in the same manner as the second embodiment contactor.) The module 52 is illustrated to be secured to a support structure 54 such as a test handler jig, not fully shown. The plurality of cantilever contactors 32 are held longitudinally in place in the module 52 by means of a spring-biased locator ball 56 which seats in a hole 26 defined by the contactor's arm 36. The lateral alignment of the contactors 32 is accomplished by a positioning bar 58 which is supported between two forward projections, 57A and 57B, of the module by a support rod 60. The positioning bar, made of a polycarbonite material, has a plurality of lateral grooves 62, as best shown in FIG. 5, perpendicular to the support rod and each having a width to accommodate the arm 36 of a contactor. As illustrated there are four grooves in the positioning bar and four contactors in the multiple contactor module. However, the module could be adapted to use fewer or more than four contactors depending on the testing requirements.

Referring to FIGS. 4 and 5, the multiple contactor module is shown in its closed position. In this position the contactor arms are securely held in the module by corresponding contact blocks 64. In operation, the contact blocks are pressed against a corresponding contactor arm pinning it against a non-conductive, flat base 65 of the module. The contact blocks are preferably gold-plated brass for maximum electrical conductivity, although they may comprise other physically rigid, highly conductive materials as well. The contact blocks are pressed against their corresponding arms by a strong clamping force supplied by two clamp springs 66 disposed in spring sockets defined by an upper housing of the module. The clamp springs react against a preferably aluminum clamp block 70 disposed in a hole defined by the module housing, the clamp block being moveable within its hole over a range to and from the contact blocks. The clamp springs urge the clamp block toward the plurality of contact blocks. Between the clamp block and the contact blocks is a non-conductive elastomeric (e.g. rubber, or rubber-like) pad 78, and so the clamp block presses against the pad which in turn presses against the contact blocks, thus transferring the clamp spring force to the contactor arms to clamp them in place.

Referring again to FIGS. 4 and 5, a preferably steel cam shaft 72 extends through an elongated channel 74 defined by the clamp block, the channel running orthogonal to the contact blocks. One end of the cam shaft is journaled for turning in the module housing, the other end being exposed and defining a wrench socket. A preferably steel cam pin 76 is seated in a longitudinal, perimetric groove defined by the cam shaft immediately adjacent a cam shaft flat 77, the cam pin radially projecting beyond the perimeter of the shaft. The channel is cylindrical except for a flat side which generally faces the flat of the cam shaft. Except for its flat side, the channel is wide enough to accommodate the projecting cam pin. The channel's flat side is defined by a preferably steel cam plate 68 which is embedded in the clamp block 70 and which intersects the channel. The clamp plate functions as a hard flat side of the channel against which the hard cam pin acts. In operation, when the cam shaft is rotated to the point at which the cam pin encounters the cam plate, further rotation will drive the cam pin against the cam plate causing the plate to move, and when it moves it causes the clamp block 70 to move away from the contact blocks. This removes the contactor arm clamping force allowing them to be inserted, removed, or replaced, whatever the case may be. To reapply the clamping force, the cam shaft is turned the opposite way to an extent that the cam pin is no longer acting against the cam plate. The clamping force and the high conductivity of the contact block provides electrical continuity between the contactor arms 36, and thus the rollers 34, and the terminals 80 of corresponding clamp blocks 64.

The embodiments described above can be used in an arrangement in which the contactors of this invention make contact with one of the terminals of a component, e.g. one end of a surface mount ceramic capacitor, with the other terminal being contacted by a stationary contact. However, rolling contactors can be used for contacting both of the terminals, depending on the arrangement of the test handler. Likewise, multiple contact modules could be constructed to allow two contactors, in close proximity, to make contact with a single terminal of the device being tested. The other terminal of the electrical device could also be contacted by either stationary contacts or also by one or two rolling contacts.

Another advantage of a rolling contact is the elimination of the "tiddly wink" effect that can occur when a cantilever wiping contact passes over a device being tested. The cantilever contact applies pressure as it tests the terminal of the device and as the device is rotated from under the cantilever contact the pressure is abruptly lost and can cause the device to snap out of the module. This is similar to a tiddly wink being snapped by the pressure abruptly being lost from an edge of the tiddly wink. With a rolling contact, the pressure is not abruptly lost and there is no "tiddly winking."

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as described herein.

We claim:

1. A rolling contactor for providing electrical signal communication between a component terminal and a support structure for said rolling contactor, comprising:

a) electrically conductive means for rolling across the component terminal to communicate one or more signals therewith;

b) a holder connectable to the support structure and in signal communication therewith, the holder comprising:

i) a pair of flanges projecting orthogonally from oposite sides of the arm at said opposite end; and, ii) a pair of aligned holes defined by respective flanges for journaling the axle ends, the axle being disposed normal to the arm; and, c) means for resiliently cantilevering the means for rolling from the holder, so as to flex in response to deflection of the means for rolling by a component, said means for cantilevering including means for communicating signals between the means for rolling and the holder, said means for cantilevering said means for rolling comprising:

i) an elongated arm, the arm being electrically conductive to provide signal communication between the means for rolling and the holder;

ii) means for connecting the arm electrically and mechanically at one end to the holder; and, iii) means for connecting the arm electrically and mechanically at an opposite end to the means for rolling; and, d) wherein said holder comprises:
  i) base means for providing a resting place for an end of the arm remote from the roller means;
  ii) means for locating the arm longitudinally and laterally into its resting place; and,
  iii) releasable clamping means, acting in opposition to the base means, for holding the arm in its resting place.

2. The contactor according to claim 1 further comprising:

a) a housing, the base means being incorporated in the housing;

b) a pair of tongues projecting, parallel to the arm, from opposite sides of the housing toward the rolling means; and, c) stop means, extending between the tongues intermediate the housing and the rolling means, for limiting movement of the arm toward a component.

3. The contactor according to claim 2 wherein the means for locating comprises:

a) a confining groove in which the arm is disposed for preventing lateral movement of the arm, the groove being defined by opposing ridges projecting from the stop means;

b) a hole defined by the arm in the clamped portion of the arm; and, c) spring-biased detent means, incorporated in the base means, for engaging the hole in the arm.

4. The contactor according to claim 1 wherein the clamping means comprises:

a) a jaw movable against or away from the arm in its resting place; and, b) spring-biased cam means, journaled in the housing, for selectively forcing the jaw against the arm, or moving the jaw away from the arm.

5. The contactor according to claim 4 wherein the jaw comprises:

a) a conductive member, adjacent the resting place, which when forced against the arm both clamps it and makes electrical contact it;

b) terminal means, extending from the block, for connection to support structure;

c) a rigid block driven by the cam means toward or away from the conductive member; and, d) an elastic pad disposed between the conductive member and the clamp block.

6. A rolling contactor for providing electrical signal communication between a plurality of component terminals and a support structure, comprising:

a) a plurality of electrical conductive means for rolling across the component terminal to communicate one or more signals therewith;

b) a holder connectable to the support structure and in signal communication therewith;

c) for each means for rolling, means for cantilevering said each means for rolling from the holder, wherein each said means for cantilevering is resilient so as to flex in response to deflection of its respective means for rolling by a component, including means for communicating signals between said each means for rolling and the holder;

d) wherein each means for cantilevering comprises:
  i) an elongated arm, the arm being electrically conductive to provide signal communication between its respective means for rolling and the holder;
  ii) means for connecting the arm electrically and mechanically at one end to the holder; and,
  iii) means for connecting the arm electrically and mechanically at an opposite end to its respective means for rolling; and, e) wherein said holder comprises:
  i) base means for providing a resting place for an end of the arm remote from the roller means;
  ii) means for locating the arm longitudinally and laterally into its resting place; and,
  iii) releasable clamping means, acting in opposition to the base means, for holding the arm in its resting place.

7. The contactor according to claim 6 further comprising:

a) a housing, the base means being incorporated in the housing;

b) a pair of tongues projecting, parallel to the arm, from opposite sides of the housing toward the rolling means; and, c) stop means, extending between the tongues intermediate the housing and the rolling means, for limiting movement of the arms toward respective components being contacted.

8. The contactor according to claim 6 wherein the means for locating comprises:

a) a plurality of respective confining grooves in which the arms are disposed for preventing lateral movement of the arms, the grooves being defined by a plurality of opposing ridges projecting from the stop means;

b) a hole defined by each arm in the clamped portion of said each arm; and, c) a plurality of spring-biased detent means, incorporated in the base means, for engaging respective holes in the arms.

9. The contactor according to claim 6 wherein the means for locating comprises:

a) a plurality of respective confining grooves in which the arms are disposed for preventing lateral movement of the arms, the grooves being defined by a plurality of opposing ridges projecting from the stop means;

b) a hole defined by each arm in the clamped portion of said each arm; and, c) a plurality of spring-biased detent means, incorporated in the base means, for engaging respective holes in the arms.

10. The contactor according to claim 4 wherein each jaw comprises:

a) a conductive member, adjacent a resting place, which when forced against an arm both clamps it and makes electrical contact it;

b) terminal means, extending from the block, for connection to support structure;

c) a rigid block driven by the cam means toward or away from the conductive member; and, d) an elastic pad disposed between the conductive member and the clamp block.

* * * * *